United States Patent
Wang

(10) Patent No.: US 9,972,651 B2
(45) Date of Patent: May 15, 2018

(54) SPECTRUM-INSPECTION DEVICE

(71) Applicant: VisEra Technologies Company Limited, Hsin-Chu (TW)

(72) Inventor: Wei-Ko Wang, Taoyuan (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 304 days.

(21) Appl. No.: 14/816,543

(22) Filed: Aug. 3, 2015

(65) Prior Publication Data

US 2017/0040367 A1 Feb. 9, 2017

(51) Int. Cl.
| | |
|---|---|
| *H01L 27/00* | (2006.01) |
| *H01L 27/146* | (2006.01) |
| *H01L 27/144* | (2006.01) |

(52) U.S. Cl.
CPC .... *H01L 27/14621* (2013.01); *H01L 27/1446* (2013.01); *H01L 27/14645* (2013.01)

(58) Field of Classification Search
CPC .......... H01L 27/14621; H01L 27/14645; G01J 3/28; G01J 3/2823; G01J 2003/2859
USPC .............................................. 250/226, 208.1
See application file for complete search history.

(56) References Cited

U.S. PATENT DOCUMENTS

| | | | | |
|---|---|---|---|---|
| 4,506,949 A | * | 3/1985 | Knop .................. | G02B 5/1871 348/291 |
| 5,258,618 A | * | 11/1993 | Noble ..................... | G01J 5/08 250/332 |
| 5,995,235 A | * | 11/1999 | Sui ....................... | G01N 21/255 250/226 |

(Continued)

FOREIGN PATENT DOCUMENTS

| | | |
|---|---|---|
| JP | 2008-191097 A | 8/2008 |
| JP | 2012-127917 A | 7/2012 |
| JP | 2013-002951 A | 1/2013 |

OTHER PUBLICATIONS

"Proceedings of the 2005 IEICE Electronics Society Conference", cited paragraph 3. Design Example, Institute of Electronics, Information, and Communication Engineers, ISSN 1349-1423, Sep. 20-23, 2005 (5 pages).

(Continued)

*Primary Examiner* — Thanh Luu
*Assistant Examiner* — Kevin Wyatt
(74) *Attorney, Agent, or Firm* — Muncy, Geissler, Olds & Lowe, P.C.

(57) ABSTRACT

A spectrum-inspection device includes a multi-band pass filter, a filter array, and a sensing layer. The multi-band pass filter allows a first waveband, a second waveband, and a third waveband of a light beam to pass through. The light beam passes through the multi-band pass filter forms a multi-band beam. The filter array is disposed under the multi-band pass filter. The filter array includes a first filter allowing wavelengths of the multi-band beam longer than a first wavelength to pass through, a second filter allowing wavelengths of the multi-band beam longer than a second wavelength to pass through, and a third filter allowing wavelengths of the multi-band beam longer than a third wavelength to pass through. The second waveband is between the first wavelength and the second wavelength, and the third waveband is between the second wavelength and the third wavelength.

12 Claims, 10 Drawing Sheets

(56) References Cited

U.S. PATENT DOCUMENTS

| | | | | |
|---|---|---|---|---|
| 7,433,042 B1* | 10/2008 | Cavanaugh | ............... | G01J 3/02 |
| | | | | 356/419 |
| 7,737,394 B2* | 6/2010 | Ovsiannikov | .......... | G03B 13/02 |
| | | | | 250/214 AL |
| 8,081,311 B2* | 12/2011 | Themelis | .............. | G01J 3/2823 |
| | | | | 348/272 |
| 2013/0271766 A1* | 10/2013 | Richards | ............... | G01J 3/2803 |
| | | | | 356/416 |

OTHER PUBLICATIONS

"Proceedings of the 2005 IEICE Electronics Society Conference", cited paragraph 3. Design Example, Institute of Electronics, Information, and Communication Engineers, ISSN 1349-1423, Sep. 20-23, 2005.

Office Action dated Oct. 25, 2016 in corresponding Japanese Patent Application No. 2016-004981.

* cited by examiner

SPECTRUM-INSPECTION DEVICE

BACKGROUND OF THE INVENTION

Field of the Invention

The present disclosure relates to a spectrum-inspection device, and in particular to a spectrum-inspection device having a filter array.

Description of the Related Art

A conventional spectrum meter is an optical system with a large number of optical elements, such as beam splitters, collimators, focusing mirrors, and linear sensors. The beam splitters may be prisms or gratings. The collimators and the focusing mirrors are configured to shorten the optical path in the optical system. Therefore, the size and weight of the conventional spectrum meter are great, and the manufacturing cost of the conventional spectrum meter is expensive.

Moreover, the linear sensor of the conventional spectrum meter is linear. The conventional spectrum meter is only used to measure a linear spectrum of a sample, and the applications of the conventional spectrum meter are restricted.

Although conventional spectrum meters have been generally adequate for their intended purposes, they have not been entirely satisfactory in all respects. Consequently, it is desirable to provide a solution for improving spectrum meters.

BRIEF SUMMARY OF THE INVENTION

The present disclosure provides a spectrum-inspection device with a small size and light weight. Moreover, the spectrum-inspection device can measure the 2D (two dimensional) spectrum of samples.

The present disclosure provides a spectrum-inspection device including a multi-band pass filter, a filter array, and a sensing layer. The multi-band pass filter allows a first waveband, a second waveband, and a third waveband of a light beam to pass through. The light beam passes through the multi-band pass filter forms a multi-band beam. The filter array is disposed under the multi-band pass filter.

The filter array includes a first filter allowing wavelengths of the multi-band beam longer than a first wavelength to pass through, a second filter allowing wavelengths of the multi-band beam longer than a second wavelength to pass through, and a third filter allowing wavelengths of the multi-band beam longer than a third wavelength to pass through.

The sensing layer is disposed under the filter array. The second waveband is between the first wavelength and the second wavelength, and the third waveband is between the second wavelength and the third wavelength.

The present disclosure provides a spectrum-inspection device including a multi-band pass filter, a filter array, and a sensing layer. The multi-band pass filter allows a first waveband, a second waveband, and a third waveband of a light beam to pass through. The light beam passes through the multi-band pass filter forms a multi-band beam. The filter array is disposed under the multi-band pass filter.

The filter array includes a first filter allowing wavelengths of the multi-band beam shorter than a first wavelength to pass through, a second filter allowing wavelengths of the multi-band beam shorter than a second wavelength to pass through, and a third filter allowing wavelengths of the multi-band beam shorter than a third wavelength to pass through.

The sensing layer is disposed under the filter array. The second waveband is between the first wavelength and the second wavelength, and the third waveband is between the second wavelength and the third wavelength.

In conclusion, the size and the weight of the spectrum-inspection device are decreased, since the filter array and the sensing layer are made by semiconductor manufacturing process, and amount of optical elements are not needed. Moreover, as a result of the filter array, a 2D spectrum of samples can be measured by the spectrum-inspection device, and the resolution of the spectrum image of the sample can be improved.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
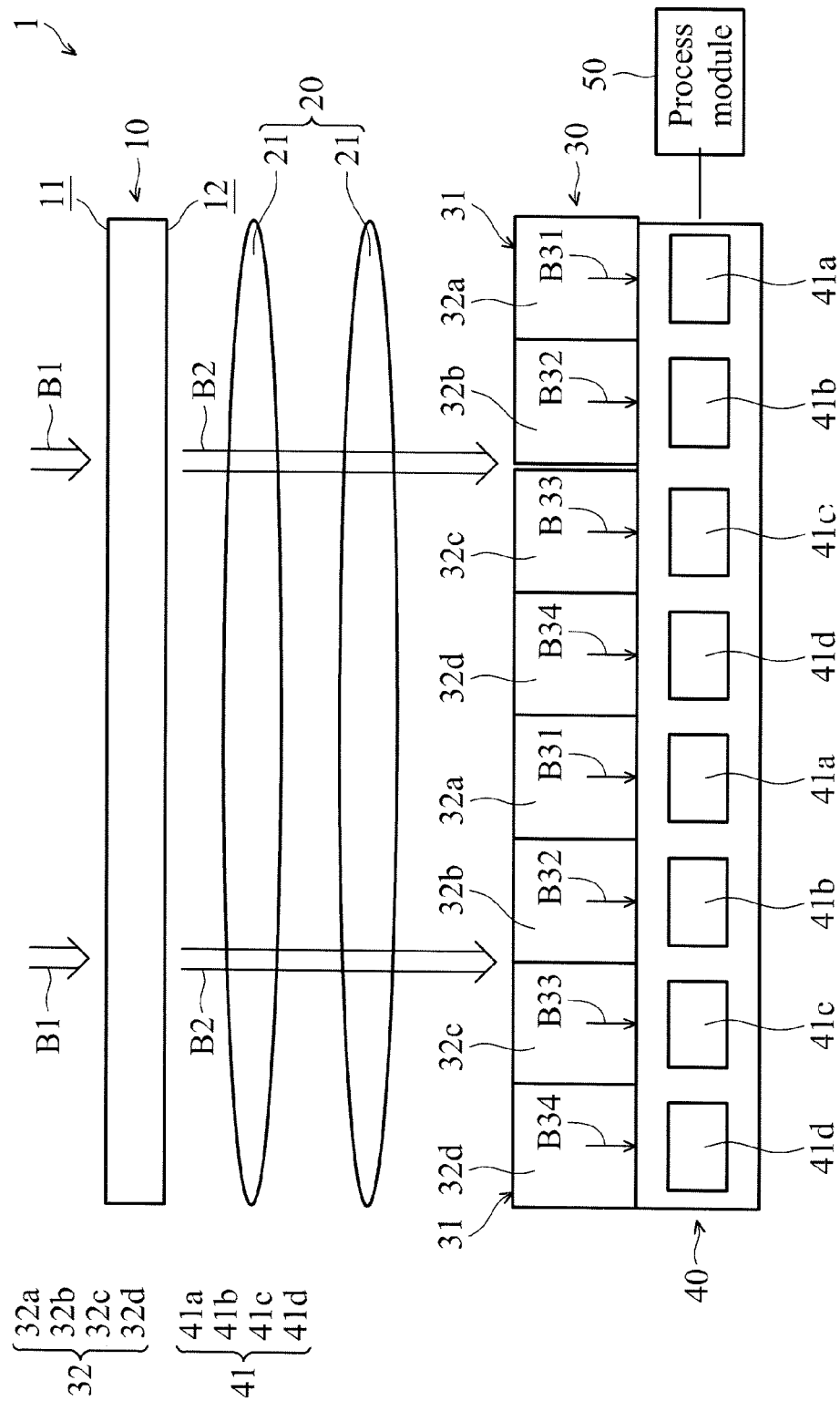
FIG. 1 is a schematic view of a spectrum-inspection device in accordance with some embodiments of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale or simplified for clarity of discussion; rather, these drawings are merely intended for illustration.

FIG. 1 is a schematic view of a spectrum-inspection device 1 in accordance with some embodiments of the present disclosure. The spectrum-inspection device 1 is configured to sensing visible wavebands and invisible wavebands of a light beam B1 reflected by or emitted from samples.

The spectrum-inspection device 1 includes a multi-band pass filter 10, a lens module 20, a filter array 30, and a sensing layer 40. The multi-band pass filter 10, the lens module 20, the filter array 30, and the sensing layer 40 are overlaid in sequence.

The multi-band pass filter 10 is a flat plate structure parallel to a plane. The multi-band pass filter 10 allows a number of wavebands of the light beam B1 to pass through, and blocks the remaining wavebands of the light beam B1 so that they cannot pass through.

The multi-band pass filter 10 has an incident surface 11 and an exiting surface 12. The incident surface 11 is parallel to the exiting surface 12. The light beam B1 enters into the multi-band pass filter 10 via the incident surface 11, and exits the multi-band pass filter 10 via the exiting surface 12. The light beam B1 passing through the multi-band pass filter 10 forms a multi-band beam B2.

Figure 2:
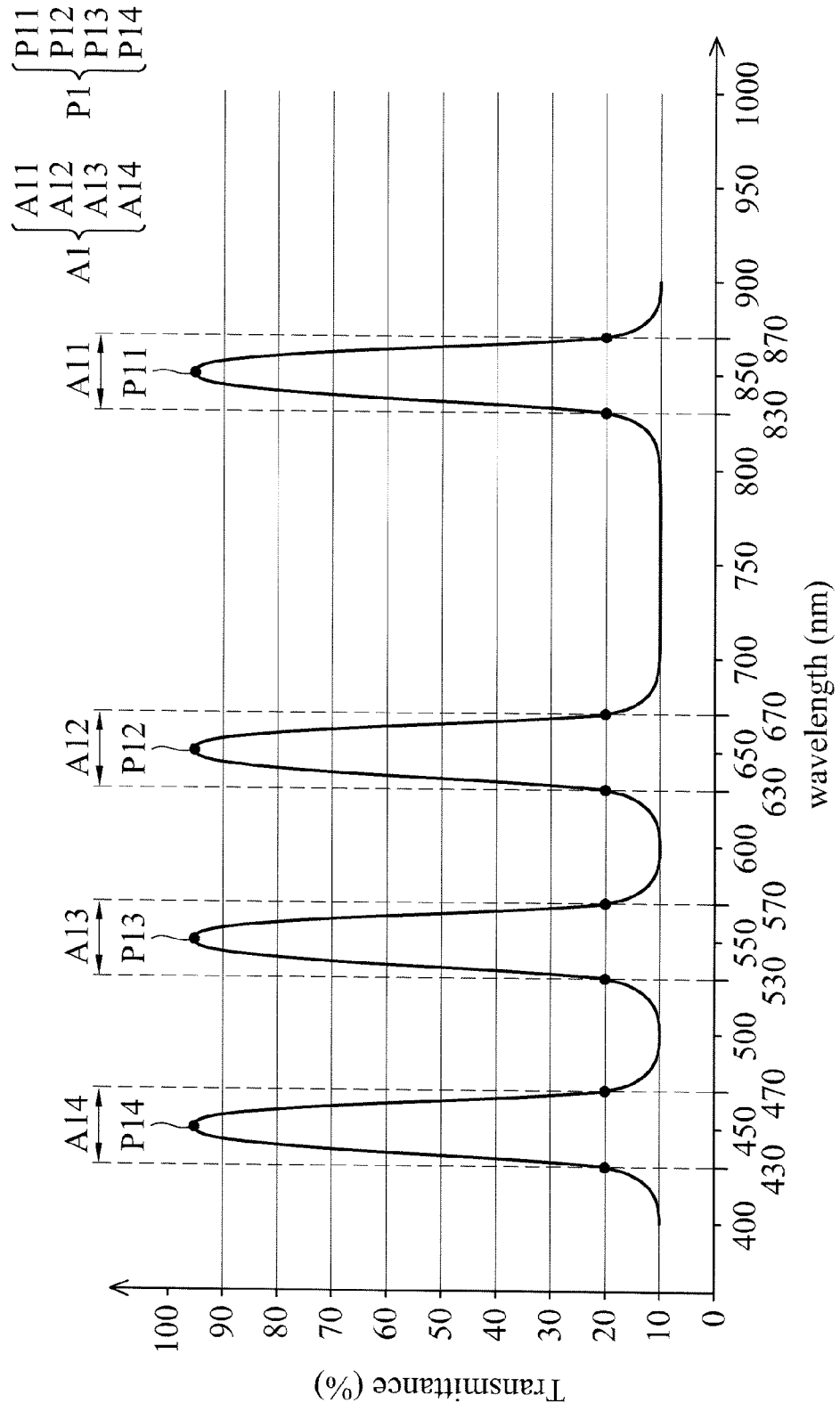
FIG. 2 is a transmittance vs. wavelength diagram of a multi-band beam in accordance with some embodiments of the present disclosure.

FIG. 2 is a transmittance vs. wavelength diagram of the multi-band beam B2 in accordance with some embodiments of the present disclosure. In some embodiments, the transmittance of the light beam B1 in the wavebands A1 to the multi-band pass filter 10 is greater than 20%, 30%, or 40%. In some embodiments, the transmittance of the light beam B1 in the wavebands A1 to the multi-band pass filter 10 in a range from about 20% to about 99.9%, or 30% to about 99.9%. In some embodiments, the transmittance of the light beam B1 not in the wavebands A1 to the multi-band pass filter 10 is lower than 20%, 30%, or 40%.

Each of the wavebands A1 includes a peak wavelength P1. In some embodiments, the transmittance of the light beam B1 at the peak wavelength P1 to the multi-band pass filter 10 is greater than 70%, 80%, or 90%. In some embodiments, the transmittance of the light beam B1 of the peak wavelengths P1 to the multi-band pass filter 10 in a range from about 70% to about 99.9%, about 80% to about 99.9%, or 90% to about 99.9%.

The number of the wavebands A1 is greater than two, three, four, or five. In this embodiment, the number of the wavebands A1 is four. Each of the wavebands A1 can be a visible waveband corresponding to a visible spectrum, or an invisible waveband corresponding to an invisible spectrum. In some embodiments, some of the wavebands A1 are visible wavebands A1, and the others are invisible wavebands A1. In some embodiments, all of the wavebands A1 are invisible wavebands A1.

In some embodiments, a waveband A11 is an invisible waveband corresponding to an invisible spectrum, such as the infrared spectrum or the far-infrared spectrum. For example, the waveband A11 is in a range from about 830 nm to about 870 nm. A peak wavelength P11 in the waveband A11 is about 850 nm. In some embodiments, the peak wavelength P11 is longer than or equal to 700 nm.

In some embodiments, a waveband A12 is a visible waveband corresponding to a visible spectrum, such as the red spectrum. For example, the waveband A12 is in a range from about 630 nm to about 670 nm. A peak wavelength P12 in the waveband A12 is about 650 nm.

In some embodiments, a waveband A13 is a visible waveband corresponding to a visible spectrum, such as the yellow spectrum. For example, the waveband A13 is in a range from about 530 nm to about 570 nm. A peak wavelength P13 in the waveband A13 is about 550 nm.

In some embodiments, a waveband A14 is a visible waveband corresponding to a visible spectrum, such as the blue spectrum. For example, the waveband A14 is in a range from about 430 nm to about 470 nm. A peak wavelength P14 in the waveband A14 is about 450 nm. In some embodiments, waveband A14 is an invisible waveband corresponding to invisible spectrum, such as ultraviolet spectrum.

In addition, all of wavebands A1 do not overlap to each other. Wavelengths or the peak wavelength P11 in the waveband A11 are longer than wavelengths or the peak wavelength P12 in the waveband A12. Wavelengths or the peak wavelength P12 in the waveband A12 are longer than wavelengths or the peak wavelength P13 in the waveband A13. Wavelengths or the peak wavelength P13 in the waveband A13 are longer than wavelengths or the peak wavelength P14 in the waveband A14.

As shown in FIG. 1, the lens module 20 is located between the multi-band pass filter 10 and the filter array 30. The lens module 20 is configured to focus the multi-band beam B2 to the filter array 30 or the sensing layer 40. In some embodiments, the lens module 20 is a telecentric lens module 20. The lens module 20 is configured to make the multi-band pass filter 10 uniformly fall on the filter array 30. In some embodiments, the lens module 20 includes one or more lenses 21.

The filter array 30 is located between the multi-band pass filter 10 and the sensing layer 40. As shown in FIG. 1, the filter array 30 is disposed under the multi-band pass filter 10, and connected to the sensing layer 40. In some embodiments, the filter array 30 is arranged on a plane that is parallel to the multi-band pass filter 10 and sensing layer 40.

The filter array 30 includes pixel groups 31 arranged in a pixel array. Each of the pixel groups 31 includes various kinds of filters 32. Each of the filters 32 allows wavelengths of the multi-band beam B2 longer than a specific wavelength or in a specific range to pass through. In this embodiment, each of the pixel groups 31 includes four kinds of filters: 32a, 32b, 32c, and 32d.

Figure 3:
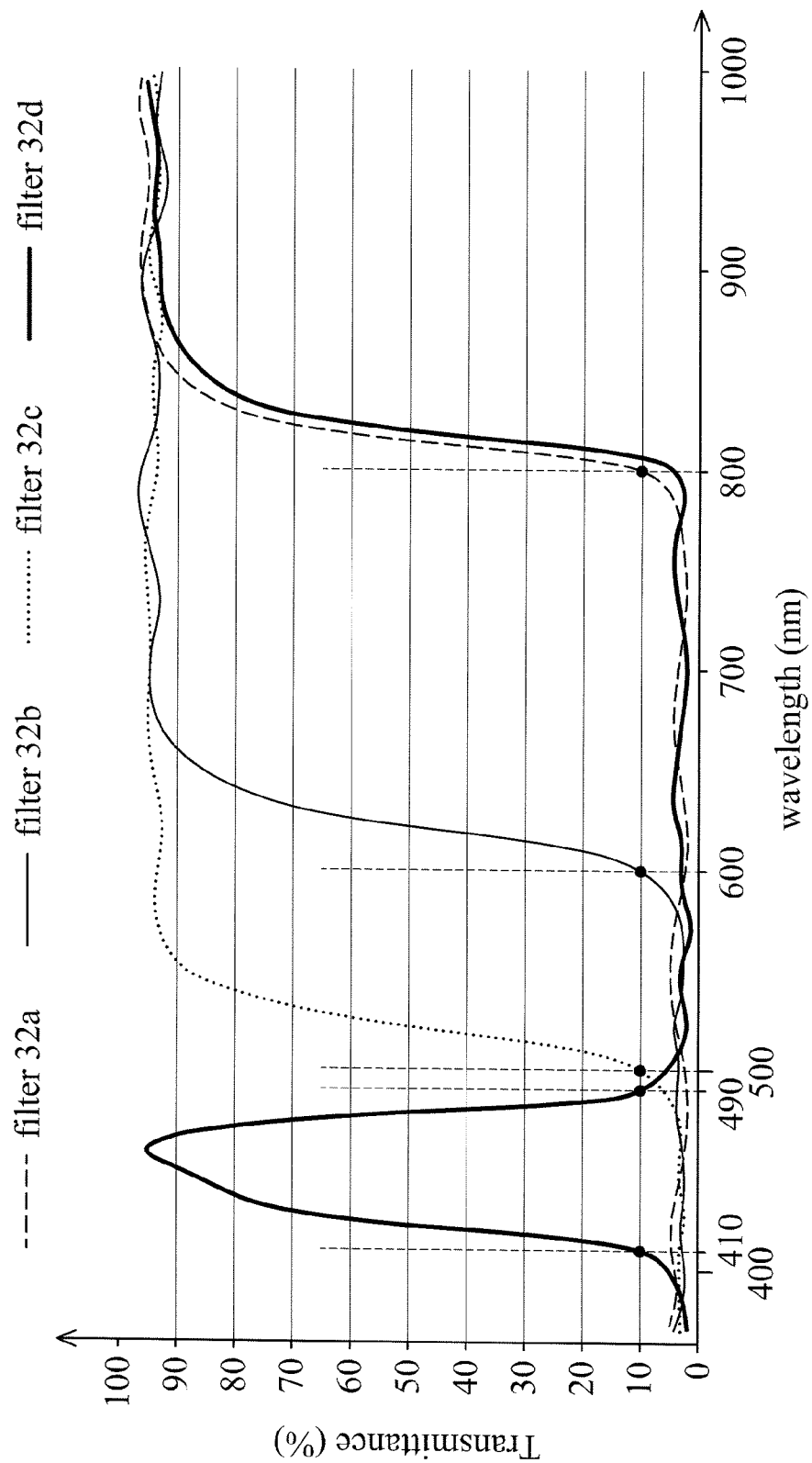
FIG. 3 is a transmittance vs. wavelength diagram of a filter array in accordance with some embodiments of the present disclosure.

FIG. 3 is a transmittance vs. wavelength diagram of the filter array 30 in accordance with some embodiments of the present disclosure. In some embodiments, the filters 32a allow wavelengths of the multi-band beam B2 longer than a first wavelength to pass through. For example, the first wavelength is about 800 nm. Therefore, the waveband A11 of the multi-band beam B2 passes through the filter 32a and forms a first beam B31. The wavebands A12, A13, and A14 of the multi-band beam B2 are blocked by the filter 32a.

In some embodiments, the filters 32b allow wavelengths of the multi-band beam B2 longer than a second wavelength to pass through. For example, the second wavelength is about 600 nm. Therefore, the wavebands A11 and A12 of the multi-band beam B2 passes through the filter 32b and forms a second beam B32. The wavebands A13 and A14 of the multi-band beam B2 are blocked by the filter 32b.

In some embodiments, the filters 32c allow wavelengths of the multi-band beam B2 longer than a third wavelength to pass through. For example, the third wavelength is about 500 nm. Therefore, the wavebands A11, A12 and A13 of the multi-band beam B2 passes through the filter 32c and forms a third beam B33. The wavebands A14 of the multi-band beam B2 are blocked by the filter 32c.

In some embodiments, the filters 32d allow wavelengths of the multi-band beam B2 longer than a fourth wavelength to pass through. For example, the fourth wavelength is about 400 nm. Therefore, the wavebands A11, A12, A13 and A14 of the multi-band beam B2 passes through the filter 32c and forms a third beam B33. In this embodiment, the filters 32d allow wavelengths of the multi-band beam B2 in a specific range and longer than the first wavelength to pass through.

For example, the specific range is from about 410 nm to about 490 nm. Therefore, the wavebands A11 and A14 of The multi-band beam B2 passes through the filter 32d and forms a fourth beam B34. The wavebands A12 and A13 of the multi-band beam B2 are blocked by the filter 32d.

In this embodiment, the first wavelength is longer than the second wavelength. The second wavelength is longer than the third wavelength. The third wavelength is longer than the fourth wavelength. Moreover, the peak wavelength P11 is longer than the first wavelength. The waveband A12 is between the first wavelength and the second wavelength, and the peak wavelength P12 is longer than the second wavelength.

In addition, the waveband A13 is between the second wavelength and the third wavelength, and the peak wavelength P13 is longer than the third wavelength. In some embodiments, the waveband A14 is between the third wavelength and the fourth wavelength, and the peak wavelength P14 is longer than the fourth wavelength. In this embodiment, the peak wavelength P14 and/or the waveband A14 is in the specific range from about 410 nm to about 490 nm relative to the filter 32d.

As shown in FIG. 1, the sensing layer 40 is disposed under the filter array 30. In this embodiment, the sensing layer 40 is parallel to the multi-band pass filter 10, and directly contacts with the filter array 30. The sensing layer 40 includes a number of sensing units 41 arranged in a sensing array. The sensing units 41 are located on a plane that is parallel to the multi-band pass filter 10.

In some embodiments, the filter array 30 and the sensing layer 40 are made by semiconductor manufacturing process. The filter array 30 and the sensing layer 40 forms an image sensor, such as a CMOS (Complementary Metal-Oxide-Semiconductor) sensor, a FSI (Frontside illumination) or BSI (backside illumination) CMOS sensor, or another suitable sensor. Therefore, the size of the weight of the filter array 30 and the sensing layer 40 can be small and light.

In this embodiment, the sensing unit 41 includes sensing units 41a, 41b, 41c, and 41d. Each of the sensing units 41a is disposed under one of the filters 32a. Each of the sensing units 41a is configured to generate a first strength signal according to the strength of the first beam B31 falling thereon.

Each of the sensing units 41b is disposed under one of the filters 32b. Each of the sensing units 41b is configured to generate a second strength signal according to the strength of the second beam B32 falling thereon.

Each of the sensing units 41c is disposed under one of the filters 32c. Each of the sensing units 41c is configured to generate a third strength signal according to the strength of the third beam B33 falling thereon.

Each of the sensing units 41d is disposed under one of the filters 32d. Each of the sensing units 41d is configured to generate a fourth strength signal according to the strength of the fourth beam B34 falling thereon.

The spectrum-inspection device 1 further includes a process module 50 electrically connected to each of the sensing units 41. The process module 50 receives the strength signals, and generates a strength values according to the strength signals.

In this embodiment, the process module 50 receives the first strength signal, and generates a first strength value according to the first strength signal. The process module 50 receives the second strength signal, and generates a second strength value according to the second strength signal.

The process module 50 receives the third strength signal, and generates a third strength value according to the third strength signal. The process module 50 receives the fourth strength signal, and generates a fourth strength value according to the fourth strength signal.

Next, the first spectrum value is obtained according to the first strength value by the process module 50. The second spectrum value is obtained by the second strength value minus the first strength value by the process module 50. The third spectrum value is obtained by the third strength value minus the second strength value by the process module 50. In other words, the Nth spectrum value is obtained by the Nth strength value minus the (N−1)th strength value. The N is an integer.

The first spectrum values correspond to the strength of the spectrum of the waveband A11 of the light beam B1. The second spectrum values correspond to the strength of the spectrum of the waveband A11 and A12 of the light beam B1. The third spectrum values correspond to the strength of the spectrum of the waveband A11, A12 and A13 of the light beam B1. The fourth spectrum values correspond to the strength of the spectrum of the waveband A11 and A14 of the light beam B1.

The first spectrum value is obtained according to the first strength value by the process module 50. The second spectrum value is obtained by the second strength value minus the first strength value by the process module 50. The third spectrum value is obtained by the third strength value minus the second strength value by the process module 50. The fourth spectrum value is obtained by the fourth strength value minus the first strength value by the process module 50.

Therefore, the spectrum values corresponding to the filters 32a, 32b, 32c, and 32d of one of the pixel groups 31 forms a pixel of a spectrum image of a sample. Since the pixel groups 31 are arranged in a pixel array, a 2D spectrum image of the sample can be generated by the process module 50 according to the spectrum values.

Since the filter array 30 and the sensing layer 40 are made by a semiconductor manufacturing process, the density of the filters 32 and the sensing unit 41 is great, and the resolution of the spectrum image of the sample can be improved.

In addition, as a result of the structure of the multi-band pass filter 10, the filters 32, and the sensing units 41, some optical elements, such as beam splitters, collimators, and focusing mirrors are not needed. Therefore, the size and the weight of the spectrum-inspection device are decreased.

Figure 4:
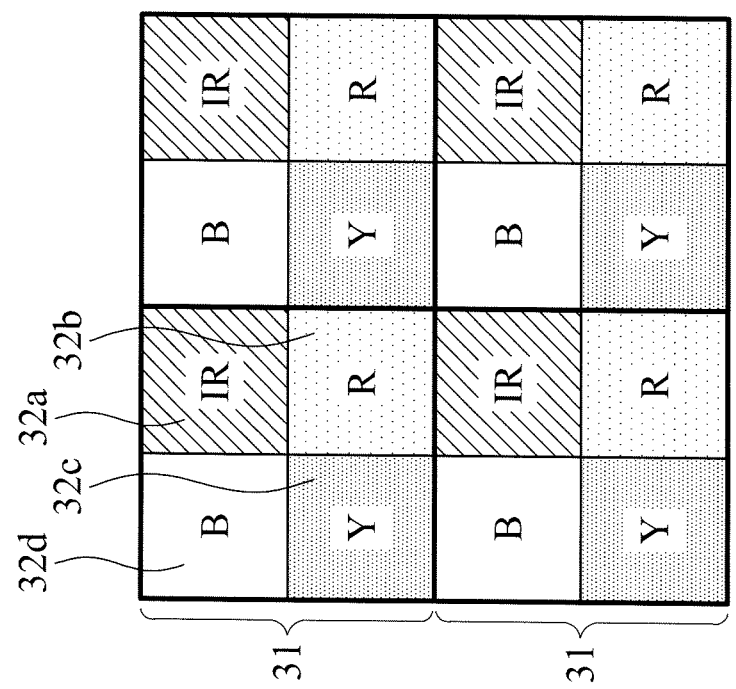
FIG. 4 is a schematic view of a filter array in accordance with some embodiments of the present disclosure.

FIG. 4 is a schematic view of the filter array 30 in accordance with some embodiments of the present disclosure. The pixel groups 31 are arranged in a pixel array. Each of the pixel groups 31 includes four kinds of filters 32a, 32b, 32c, and 32d. The filters 32a, 32b, 32c, and 32d are arranged in a 2×2 matrix.

Figure 5B:
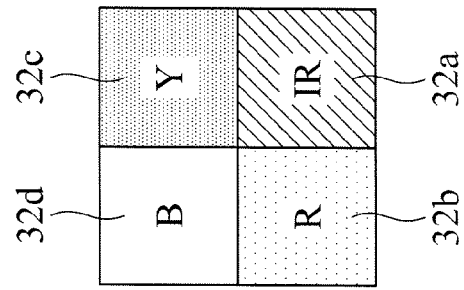
FIGS. 5A to 5F are schematic views of pixel groups in accordance with some embodiments of the present disclosure.
Figure 5A:
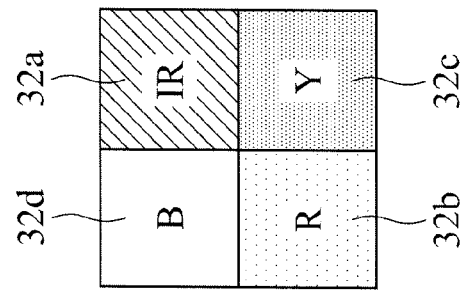

FIGS. 5A to 5F are schematic views of the pixel group 31 in accordance with some embodiments of the present disclosure. FIGS. 5A to 5B show the different arrangements of the filters 32a, 32b, 32c, and 32d of FIG. 4 for different kinds of samples.

As shown in FIGS. 1, and 5C to 5F, the pixel group 31 includes six filters 32. The filter 32a is adjacent or connected to the filter 32b, the filter 32b is adjacent or connected to the filter 32c, and the filter 32c is adjacent or connected to the filter 32d. The filter 32d is adjacent or connected to the fifth filter 32e, and the fifth filter 32e is adjacent or connected to the sixth filter 32f.

The fifth filters 32e allow wavelengths of the multi-band beam B2 longer than a fifth wavelength to pass through. The sixth filters 32f allow wavelengths of the multi-band beam B2 longer than a sixth wavelength to pass through. The fourth wavelength is longer than the fifth wavelength. The fifth wavelength is longer than the sixth wavelength.

In some embodiments, the first wavelength is about 900 nm, the second wavelength is about 800 nm, the third wavelength is about 700 nm, the fourth wavelength is about 600 nm, the fifth wavelength is about 500 nm, and the sixth wavelength is about 400 nm. In other words, the wavelengths of the first to sixth wavelengths are gradually increased.

Figures 5C, 5D:
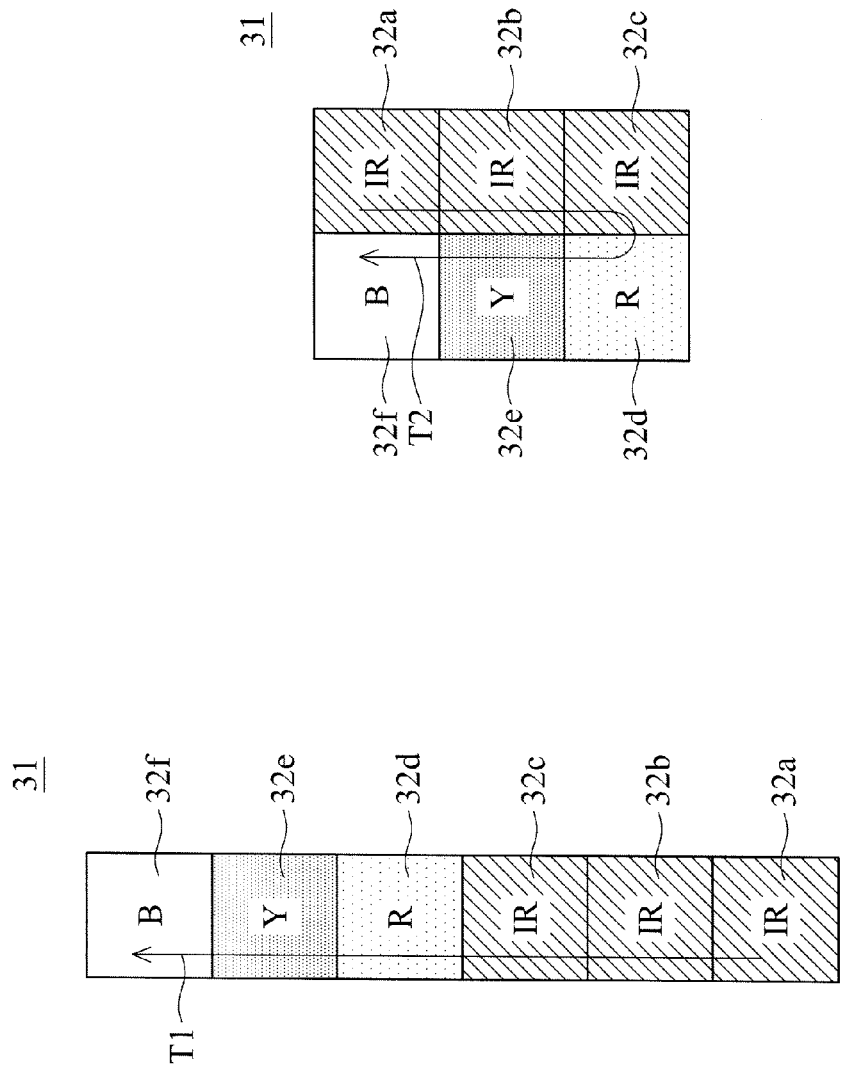
Figure 5F:
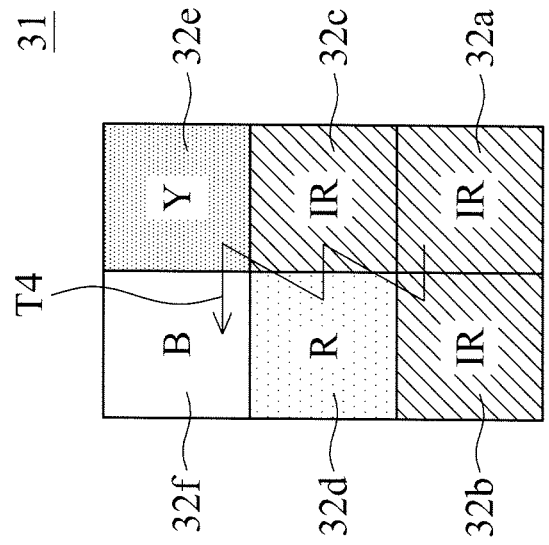
Figure 5E:
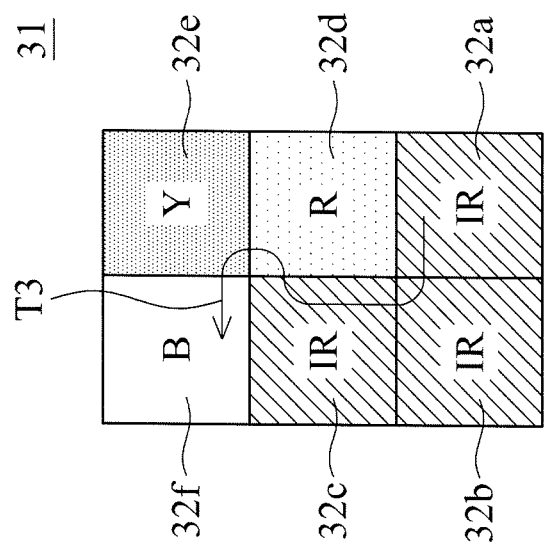

As shown in FIG. 5C, the first filter 32a to sixth filter 32f are arranged along a linear path T1 in sequence. As shown in FIG. 5D, the first filter 32a to sixth filter 32f are arranged along a U-shaped path T2 in sequence. As shown in FIG. 5E, the first filter 32a to sixth filter 32f are arranged along a wave-shaped path T3 in sequence. As shown in FIG. 5F, the first filter 32a to sixth filter 32f are arranged along a serration-shaped path T4 in sequence.

Figure 6A:
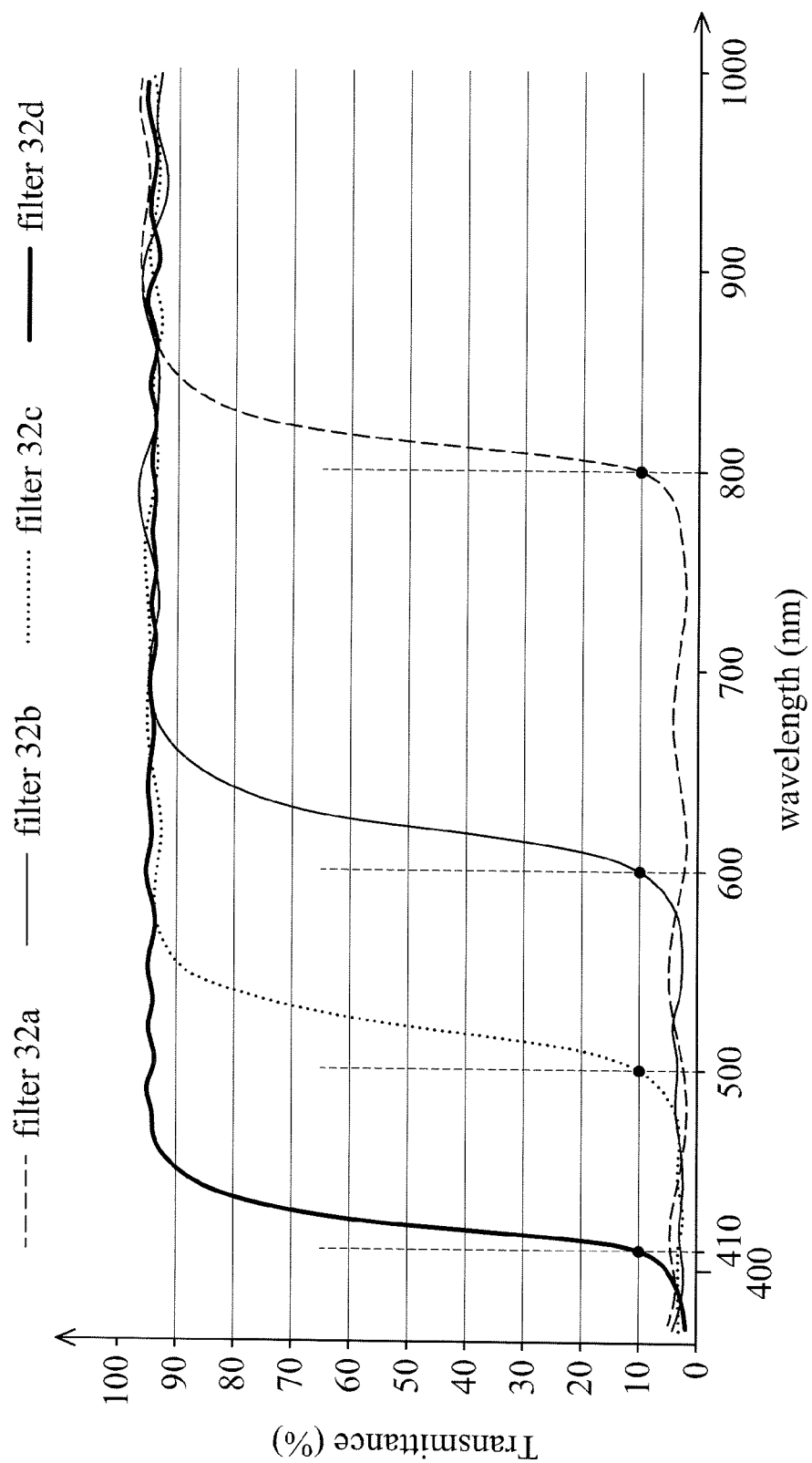
FIGS. 6A and 6B are transmittance vs. wavelength diagrams of filter arrays in accordance with some embodiments of the present disclosure.

FIG. 6A is a transmittance vs. wavelength diagram of a filter array 30 in accordance with some embodiments of the present disclosure. In some embodiments, the filters 32a allow wavelengths of the multi-band beam B2 longer than a first wavelength to pass through. For example, the first wavelength is about 800 nm.

The filters 32b allow wavelengths of the multi-band beam B2 longer than a second wavelength to pass through. For example, the second wavelength is about 600 nm. The filters 32c allow wavelengths of the multi-band beam B2 longer than a third wavelength to pass through. For example, the third wavelength is about 500 nm.

The filters 32d allow wavelengths of the multi-band beam B2 longer than a fourth wavelength to pass through. For example, the fourth wavelength is about 400 nm or 410 nm. Therefore, the first wavelength is longer than the second wavelength, the second wavelength is longer than the third wavelength, and the third wavelength is longer than the fourth wavelength.

The wavelengths and/or the peak wavelength P11 in the waveband A11 are longer than the first wavelength. The waveband A12 is between the first wavelength and the second wavelength. The waveband A13 is between the second wavelength and the third wavelength. The waveband A14 is between the third wavelength and the fourth wavelength.

Figure 6B:
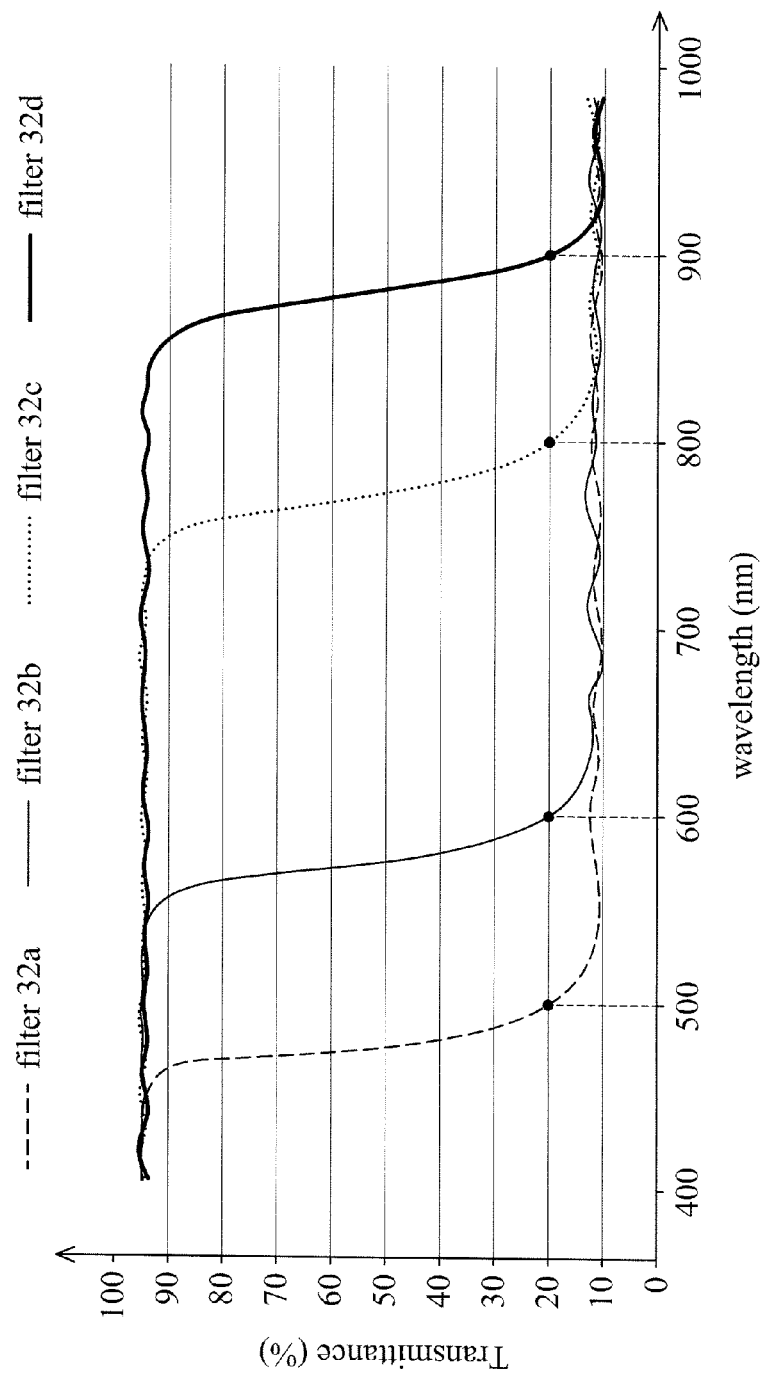

FIG. 6B is a transmittance vs. wavelength diagram of a filter array 30 in accordance with some embodiments of the present disclosure. In some embodiments, the filters 32a allow wavelengths of the multi-band beam B2 shorter than a first wavelength to pass through. For example, the first wavelength is about 500 nm.

The filters 32b allow wavelengths of the multi-band beam B2 shorter than a second wavelength to pass through. For example, the second wavelength is about 600 nm. The filters 32c allow wavelengths of the multi-band beam B2 shorter than a third wavelength to pass through. For example, the third wavelength is about 800 nm.

The filters 32d allow wavelengths of the multi-band beam B2 shorter than a fourth wavelength to pass through. For example, the fourth wavelength is about 900 nm. Therefore, the first wavelength is shorter than the second wavelength, the second wavelength is shorter than the third wavelength, and the third wavelength is shorter than the fourth wavelength.

The waveband A11 is between the third wavelength and the fourth wavelength. The waveband A12 is between the second wavelength and the third wavelength. The waveband A13 is between the first wavelength and the second wavelength. The wavelengths and/or the peak wavelength P14 in the waveband A14 are shorter than the first wavelength.

Figure 7:
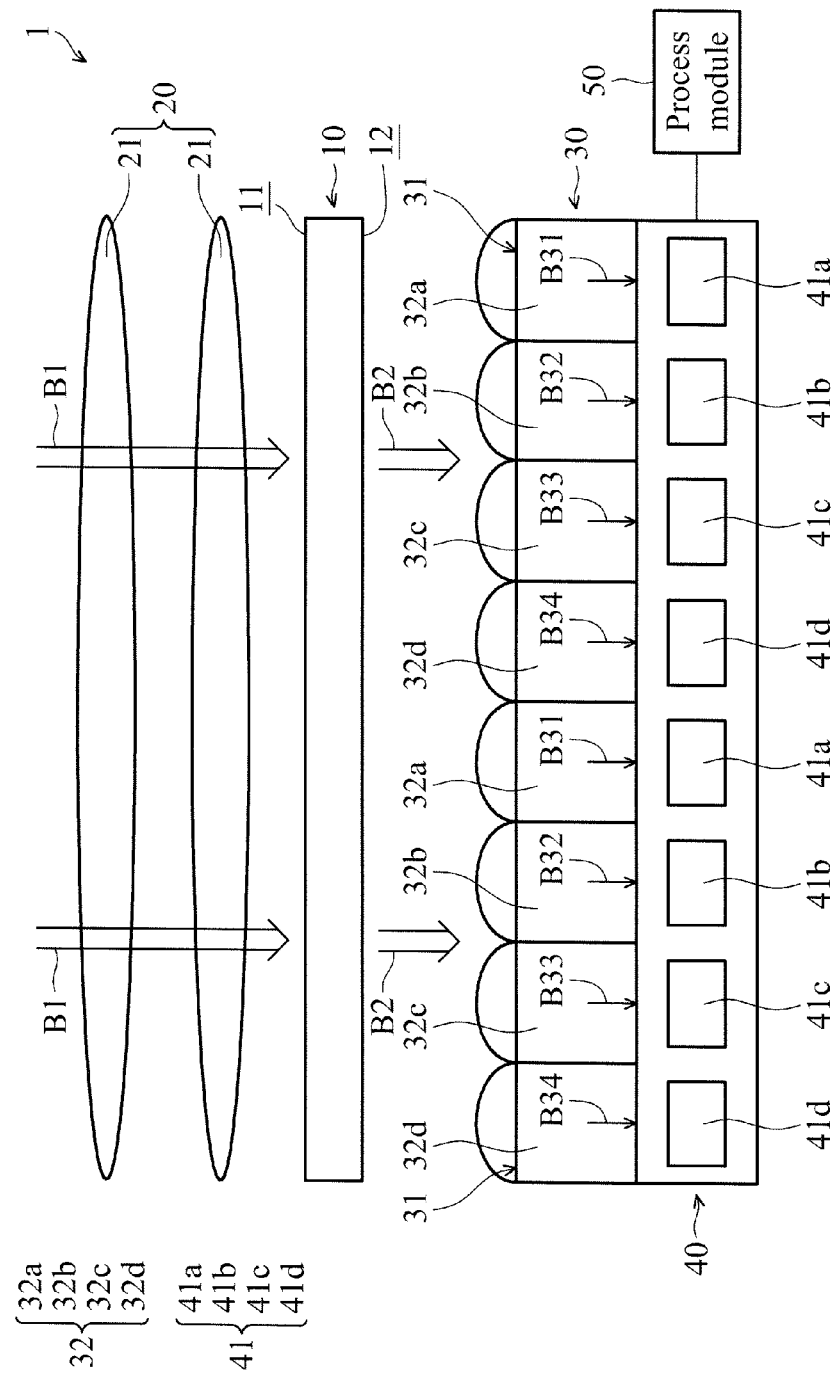
FIG. 7 is a schematic view of a spectrum-inspection device in accordance with some embodiments of the present disclosure.

FIG. 7 is a schematic view of a spectrum-inspection device 1 in accordance with some embodiments of the present disclosure. The lens module 20 is located over the multi-band pass filter 10 and the filter array 30. The spectrum-inspection device 1 further includes microlenses 60 disposed on the filter array 30. The microlens 60 is configured to focus the multi-band beam B2 to the filters 32 or the sensing units 41.

In conclusion, the size and the weight of the spectrum-inspection device are decreased, since the filter array and the sensing layer are made by the semiconductor manufacturing process, and a number of optical elements are not needed. Moreover, as a result of the filter array, a 2D spectrum of samples can be measured by the spectrum-inspection device, and the resolution of the spectrum image of the sample can be improved.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A spectrum-inspection device, comprising:
    a multi-band pass filter allowing a first waveband, a second waveband, and a third waveband of a light beam to pass through, wherein the light beam passing through the multi-band pass filter forms a multi-band beam;
    a filter array, disposed under the multi-band pass filter, comprising:
    a first filter allowing wavelengths of the multi-band beam longer than a first wavelength to pass through;
    a second filter allowing wavelengths of the multi-band beam longer than a second wavelength to pass through; and
    a third filter allowing wavelengths of the multi-band beam longer than a third wavelength to pass through; and
    a sensing layer, disposed under the filter array, generating a first strength signal, a second strength signal, and a third strength signal according to a strength of the multi-band beam passing through the filter array and falling on the sensing layer,
    wherein the second waveband is between the first wavelength and the second wavelength, and the third waveband is between the second wavelength and the third wavelength,
    wherein a first strength value is generated according to the first strength signal, a second strength value is generated according to the second strength signal, and a third strength value is generated according to the third strength signal,
    wherein a first spectrum value corresponding to the first waveband is obtained according to the first strength value, a second spectrum value corresponding to the second waveband is obtained by the second strength value minus the first strength value, a third spectrum value corresponding to the third waveband is obtained by the third strength value minus the second strength value.

2. The spectrum-inspection device as claimed in claim 1, wherein the first wavelength is longer than the second wavelength, the second wavelength is longer than the third wavelength, a first peak wavelength in the first waveband is longer than a second peak wavelength in the second waveband, and the second peak wavelength in the second waveband is longer than a third peak wavelength in the third waveband, wherein the first peak wavelength is longer than the first wavelength.

3. The spectrum-inspection device as claimed in claim 1, wherein the first filter is adjacent to the second filter, and the second filter is adjacent to the third filter.

4. The spectrum-inspection device as claimed in claim 1, wherein the multi-band beam passing through the first filter forms a first beam, passing through the second filter forms a second beam, and passing through the third filter forms a third beam, and the sensing layer further comprises:
   a first sensing unit, disposed under the first filter, configured to generate the first strength signal according to the strength of the first beam falling thereon;
   a second sensing unit, disposed under the second filter, configured to generate the second strength signal according to the strength of the second beam falling thereon; and
   a third sensing unit, disposed under the third filter, configured to generate the third strength signal according to the strength of the third beam falling thereon.

5. The spectrum-inspection device as claimed in claim 1, further comprising a lens module located between or over the multi-band pass filter and the filter array.

6. The spectrum-inspection device as claimed in claim 1, wherein the lens module is a telecentric lens module.

7. A spectrum-inspection device, comprising:
   a multi-band pass filter allowing a first waveband, a second waveband, and a third waveband of a light beam to pass through, wherein the light beam passing through the multi-band pass filter forms a multi-band beam;
   a filter array, disposed under the multi-band pass filter, comprising:
      a first filter allowing wavelengths of the multi-band beam shorter than a first wavelength to pass through;
      a second filter allowing wavelengths of the multi-band beam shorter than a second wavelength to pass through; and
      a third filter allowing wavelengths of the multi-band beam shorter than a third wavelength to pass through; and
   a sensing layer, disposed under the filter array, generating a first strength signal, a second strength signal, and a third strength signal according to a strength of the multi-band beam passing through the filter array and falling on the sensing layer,
   wherein the second waveband is between the first wavelength and the second wavelength, and the third waveband is between the second wavelength and the third wavelength,
   wherein a first strength value is generated according to the first strength signal, a second strength value is generated according to the second strength signal, and a third strength value is generated according to the third strength signal,
   wherein a first spectrum value corresponding to the first waveband is obtained according to the first strength value, a second spectrum value corresponding to the second waveband is obtained by the second strength value minus the first strength value, a third spectrum value corresponding to the third waveband is obtained by the third strength value minus the second strength value.

8. The spectrum-inspection device as claimed in claim 7, wherein the first wavelength is shorter than the second wavelength, the second wavelength is shorter than the third wavelength, a first peak wavelength in the first waveband is shorter than a second peak wavelength in the second waveband, and the second peak wavelength in the second waveband is shorter than a third peak wavelength in the third waveband, wherein the first peak wavelength is shorter than the first wavelength.

9. The spectrum-inspection device as claimed in claim 7, wherein the first filter is adjacent to the second filter, and the second filter is adjacent to the third filter.

10. The spectrum-inspection device as claimed in claim 7, wherein the multi-band beam passing through the first filter forms a first beam, passing through the second filter forms a second beam, and passing through the third filter forms a third beam, and the sensing layer further comprises:
    a first sensing unit, disposed under the first filter, configured to generate the first strength signal according to the strength of the first beam falling thereon;
    a second sensing unit, disposed under the second filter, configured to generate the second strength signal according to the strength of the second beam falling thereon; and
    a third sensing unit, disposed under the third filter, configured to generate the third strength signal according to the strength of the third beam falling thereon.

11. The spectrum-inspection device as claimed in claim 7, further comprising a lens module located between or over the multi-band pass filter and the filter array.

12. The spectrum-inspection device as claimed in claim 11, wherein the lens module is a telecentric lens module.

* * * * *